(12) United States Patent
Bai et al.

(10) Patent No.: US 11,997,869 B2
(45) Date of Patent: May 28, 2024

(54) DISPLAY PANEL AND DISPLAY DEVICE (71) Applicant: WUHAN CHINA STAR OPTOELECTRONICS SEMICONDUCTOR DISPLAY TECHNOLOGY CO., LTD., Hubei (CN)

(72) Inventors: Dan Bai, Hubei (CN); Yu Zhao, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 428 days.

(21) Appl. No.: 17/600,040

(22) PCT Filed: Sep. 2, 2021

(86) PCT No.: PCT/CN2021/116249
§ 371 (c)(1),
(2) Date: Sep. 29, 2021

(87) PCT Pub. No.: WO2023/015627
PCT Pub. Date: Feb. 16, 2023

(65) Prior Publication Data
US 2023/0049125 A1 Feb. 16, 2023

(30) Foreign Application Priority Data
Aug. 11, 2021 (CN) .......................... 202110920218.9

(51) Int. Cl.
*H10K 59/12* (2023.01)
*H10K 50/844* (2023.01)
*H10K 59/122* (2023.01)

(52) U.S. Cl.
CPC ......... *H10K 50/844* (2023.02); *H10K 59/122* (2023.02)

(58) Field of Classification Search
CPC ........................... H10K 50/844; H10K 59/122
USPC ............................................................ 257/40
See application file for complete search history.

(56) References Cited

U.S. PATENT DOCUMENTS

2004/0090178 A1   5/2004  Chuang
2019/0333972 A1  10/2019  Ding et al.

FOREIGN PATENT DOCUMENTS

| CN | 106887523 A | 6/2017 |
|---|---|---|
| CN | 107579171 A | 1/2018 |
| CN | 110265583 A | 9/2019 |
| CN | 110416435 A | 11/2019 |

(Continued)

*Primary Examiner* — Phuc T Dang
(74) *Attorney, Agent, or Firm* — HSML P.C.

(57) ABSTRACT

A display panel and a display device are provided. A first organic layer of the display panel forms a first barrier portion in a transition area. A first metal layer forms a second barrier portion in the transition area. The second barrier portion covers an upper surface and a first side surface of the first barrier portion, and extends away from the first side surface and beyond a boundary of the upper surface of the first barrier portion, so as to form an undercut structure. Therefore, the problem that in conventional OLED products, water and oxygen gas are easily transmitted from outside of the display panel to inside using the emission layer is alleviated.

20 Claims, 5 Drawing Sheets (56) References Cited

FOREIGN PATENT DOCUMENTS

| | | | | |
|---|---|---|---|---|
| CN | 110600526 A | 12/2019 | | |
| CN | 111834400 A | * 10/2020 | ........... | H01L 27/156 |
| CN | 211719594 U | 10/2020 | | |
| CN | 113066932 A | 7/2021 | | |
| CN | 112164714 A | * 10/2021 | ......... | H01L 27/3218 |

* cited by examiner

DISPLAY PANEL AND DISPLAY DEVICE

FIELD OF INVENTION

The present disclosure relates to the technical field of display, and in particular, to a display panel and a display device.

BACKGROUND OF INVENTION

As a new display technology, an organic light-emitting display (OLED) technology has numerous unique advantages over other display technologies, such as a wide viewing angle, a high contrast, a fast response, low power consumption, foldability/flexibility, and the like. Therefore, the OLED has strong competitiveness.

With the extensive development and in-depth application of the OLED technology, the pursuit of a high-screen-to-body ratio (or even full-screen) for display screens having a better visual experience has become one of the current trends in the development of display technologies. Technologies, such as O-Cut and "Beauty Tip" have greatly increased the screen-to-body ratio of the display screen, but the O-Cut technology is limited to hole punching in the display area. The hole design requires all substrates in the camera area to be hollowed out to form through holes. In this way, sides of an emission layer are exposed, so that external water and oxygen gas are easily transmitted from outside of the display panel to inside along the light emitting layer using the sides, causing a problem of poor reliability.

Therefore, the technical problem that in conventional OLED products, water and oxygen gas are easily transmitted from outside of the display panel to inside using the light emitting layer requires to be resolved.

SUMMARY OF INVENTION

Technical Problem

The present disclosure provides a display panel and a display device, so as to alleviate the technical problem that in conventional OLED products, water and oxygen gas are easily transmitted from outside of the display panel to inside using the emission layer.

Technical Solution

To resolve the foregoing problems, the technical solutions provided in the present disclosure are described as follows:

An embodiment of the present disclosure provides a display panel, including a functional area, a display area close to the functional area, and a transition area located between the functional area and the display area, and in the transition area, including:
  a substrate;
  an inorganic layer, disposed on the substrate;
  a first organic layer, disposed on a side of the inorganic layer that is away from the substrate and forming, in the transition area, a plurality of first barrier portions spaced apart from each other; and
  a first metal layer, disposed on a side of the first organic layer that is away from the inorganic layer and forming, in the transition area, second barrier portions covering the first barrier portions, wherein
  each of the second barrier portions covers an upper surface and a first side surface of each first barrier portion, and the each second barrier portion covering the upper surface of the each first barrier portion extends away from the first side surface and beyond a boundary of the upper surface.

In the display panel provided in the embodiment of the present disclosure, the first metal layer forms a first source/drain line in the display area, the display panel further includes a second metal layer disposed on a side of the inorganic layer that faces the first organic layer, the first organic layer covers the second metal layer, the second metal layer forms a second source/drain line in the display area, and the second source/drain line is connected to the first source/drain line through a via in the first organic layer.

In the display panel provided in the embodiment of the present disclosure, the display panel further includes:
  a second organic layer, covering the first metal layer and the first organic layer;
  a conductive electrode layer, disposed on the second organic layer and forming a pixel electrode in the display area, wherein the pixel electrode is connected to the first source/drain line through a via in the second organic layer; and
  a pixel definition layer, covering a part of the pixel electrode and the second organic layer, wherein a pixel opening is formed in the display area.

In the display panel provided in the embodiment of the present disclosure, the inorganic layer includes a buffer layer, a gate insulating layer, and an interlayer insulating layer that are stacked, and the display panel further includes:
  a semiconductor layer, disposed on the buffer layer and including a source region and a drain region; and
  a gate layer, disposed on the gate insulating layer, wherein the second metal layer is disposed on the interlayer insulating layer, the second source/drain line includes a first source line and a first drain line, and the first source line and the first drain line are respectively connected to the corresponding source region and the corresponding drain region through vias in the interlayer insulating layer.

In the display panel provided in the embodiment of the present disclosure, a retaining wall structure is further disposed on the inorganic layer in the transition area, and the retaining wall structure is located on a side of the first barrier portion that is close to the display area, and includes a first retaining wall portion, a second retaining wall portion, and a third retaining wall portion that are stacked, wherein the first retaining wall portion is formed by the second organic layer, and the second retaining wall portion is formed by the pixel definition layer.

In the display panel provided in the embodiment of the present disclosure, an included angle between a second side surface of the first barrier portion that is not covered by the second barrier portion and the second barrier portion beyond the upper surface is greater than or equal to 90 degrees.

In the display panel provided in the embodiment of the present disclosure, a width of the second barrier portion beyond the upper surface ranges from 1 micrometer to 100 micrometers.

In the display panel provided in the embodiment of the present disclosure, a corresponding groove is provided in an area of the inorganic layer in the transition area that is between adjacent first barrier portions, and an extending direction of the groove is same as an extending direction of the first barrier portion.

In the display panel provided in the embodiment of the present disclosure, the groove is provided close to a second side surface of the first barrier portion that is not covered by the second barrier portion.

In the display panel provided in the embodiment of the present disclosure, the groove extends through at least part of the inorganic layer.

In the display panel provided in the embodiment of the present disclosure, a quantity of the first barrier portions is greater than or equal to 5, and two adjacent first barrier portions are spaced apart by a spacing.

In the display panel provided in the embodiment of the present disclosure, every two adjacent first barrier portions are spaced apart by a same spacing.

An embodiment of the present disclosure further provides a display device, including the display panel of one of the above embodiments and a functional element corresponding to the functional area of the display panel.

Beneficial Effects

In the display panel and the display device provided in the present disclosure, the first organic layer of the display panel forms a first barrier portion in the transition area. The first metal layer of the display panel forms a second barrier portion in the transition area. The second barrier portion covers an upper surface and a first side surface of the first barrier portion, and the second barrier portion covering the upper surface of the first barrier portion extends away from the first side surface and beyond a boundary of the upper surface, so as to form an undercut structure. In this way, during preparation of emission layers, the light emitting layers are disconnected at the undercut structure to block the water and oxygen immersion path formed by the light emitting layers, thereby resolving the problem that in conventional OLED products, water and oxygen gas are easily transmitted from outside of the display panel to inside using the light emitting layer, and improving the reliability of packaging in the transition area.

BRIEF DESCRIPTION OF DRAWINGS

To describe the technical solutions in embodiments or the existing technology more clearly, the following briefly describes the accompanying drawings required for describing the embodiments or the existing technology. Apparently, the accompanying drawings in the following description show merely some embodiments of the present disclosure, and a person of ordinary skill in the art may derive other drawings according to these accompanying drawings without creative efforts.

DETAILED DESCRIPTION OF PREFERRED EMBODIMENTS

The following description of various embodiments is provided to exemplify the specific embodiments for implementation of the present disclosure with reference to accompanying drawings. The directional terms mentioned in the present disclosure, such as "above", "below", "front", "back", "left", "right", "in", "out", and "side", merely refer to the directions in the accompanying drawings. Therefore, the used direction terms are intended to describe and understand the present disclosure, but are not intended to limit the present disclosure. In the figures, structurally similar units are denoted by the same reference numerals. In the accompanying drawings, for clear understanding and ease description, the thickness of some layers and regions are exaggerated. In other words, the size and thickness of each component shown in the drawings are arbitrarily shown, but the present disclosure is not limited thereto.

Figure 1:
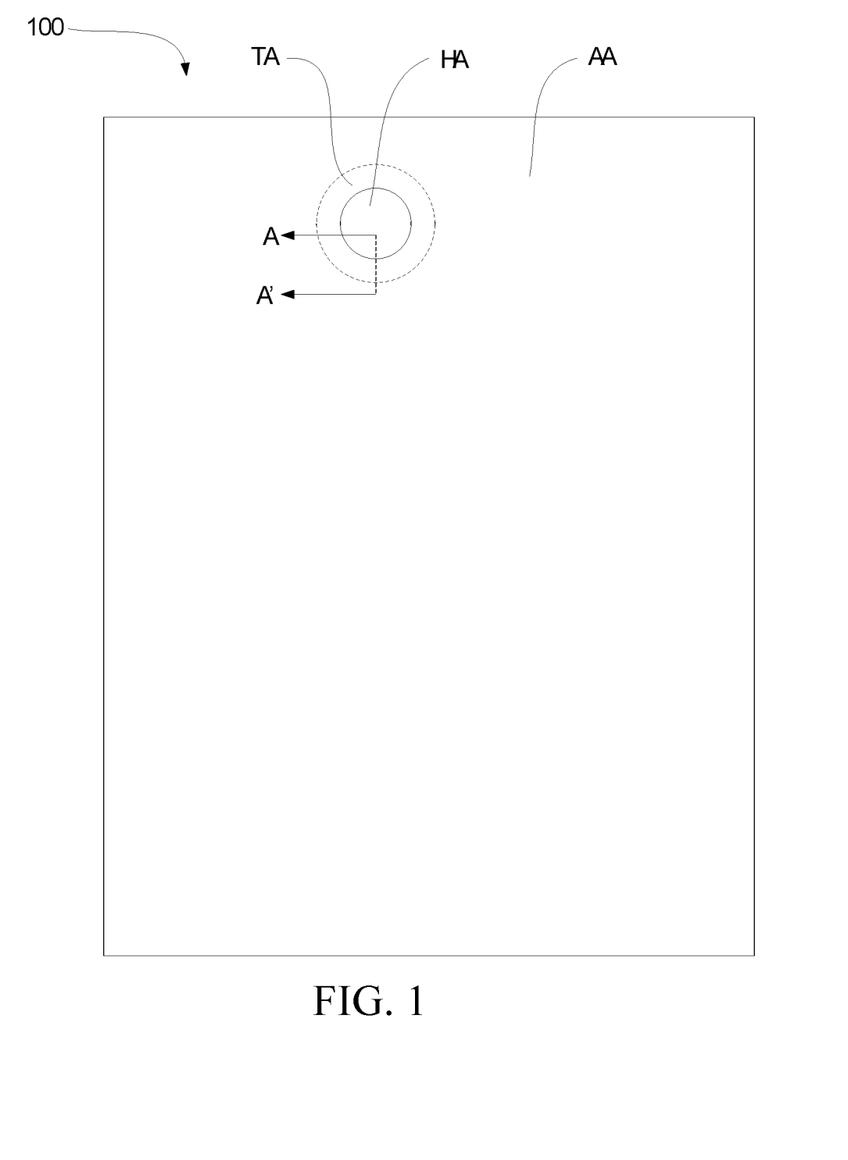
FIG. 1 is a schematic top view of a structure of a display panel according to an embodiment of the present disclosure.
Figure 2:
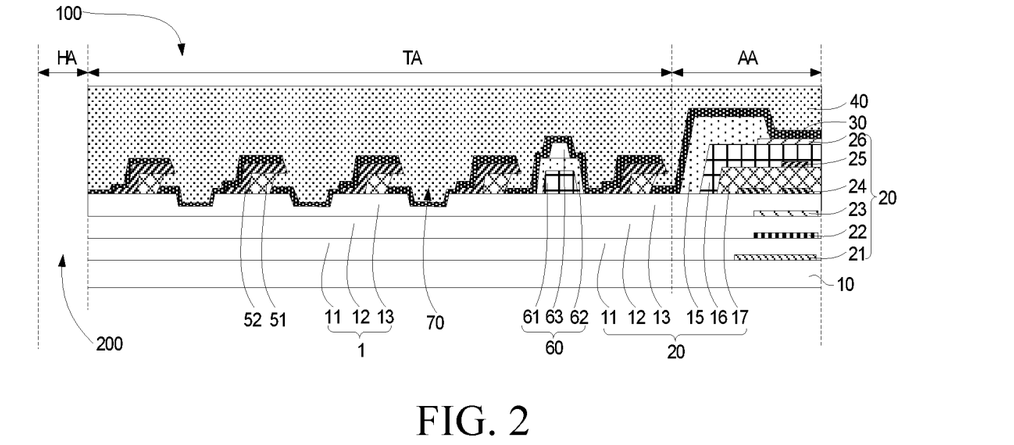
FIG. 2 is a schematic diagram of a cross-sectional structure taken along line A-A' in FIG. 1.

Refer to FIGS. 1 and 2 together. FIG. 1 is a schematic top view of a structure of a display panel according to an embodiment of the present disclosure. FIG. 2 is a schematic diagram of a cross-sectional structure taken along line A-A' in FIG. 1. A display panel 100 includes a functional area HA, a display area AA close to the functional area HA, and a transition area TA located between the functional area HA and the display area AA. An opening 200 is provided in the functional area HA. Functional elements, such as a receiver, a camera, and various sensors can be disposed in the opening 200 to implement functions, such as an under-screen camera, an under-screen fingerprint, and the like, thereby increasing the screen-to-body ratio of the display panel 100.

In addition, according to actual requirements, the functional area HA may be located in any area of the display panel 100. For example, the functional area HA may be located in a middle area or an edge area of the display panel 100. The transition area TA is located between the functional area HA and the display area AA. When the functional area HA is located in the middle area of the display panel 100, the transition area TA surrounds the functional area HA. When the functional area HA is located in the edge area of the display panel 100, the transition area TA half surrounds the functional area HA. The transition area TA is disposed to achieve a smooth transition from the functional area HA to the display area AA, so as to reduce the influence of the functional area HA on the display area AA.

In detail, the display panel further includes a substrate and an inorganic layer, a first organic layer, and a first metal layer that are stacked on the substrate in sequence. The first organic layer is disposed on a side of the inorganic layer that is away from the substrate, and forms, in the transition area, a plurality of first barrier portions spaced apart from each other. The first metal layer is disposed on a side of the first organic layer that is away from the inorganic layer, and forms, in the transition area, second barrier portions covering the first barrier portions.

Each second barrier portion covers an upper surface and a first side surface of each first barrier portion, and the each second barrier portion covering the upper surface of the each first barrier portion extends away from the first side surface and beyond a boundary of the upper surface, so as to form an undercut structure. In this way, during preparation of emission layers, the emission layers are disconnected at the undercut structure to block the water and oxygen immersion path formed by the emission layers, thereby resolving the problem that in conventional OLED products, water and oxygen gas are easily transmitted from outside of the display panel to inside using the emission layer, and improving the reliability of packaging in the transition area.

A film structure of the display panel 100 in each area is to be described in detail below.

The display panel 100 includes a substrate 10 and a driving circuit layer 20, a light-emitting function layer 30, and a packaging layer 40 that are disposed on the substrate 10 in sequence. The substrate 10, the driving circuit layer 20, the light-emitting function layer 30, and the packaging layer 40 are hollowed out in the corresponding functional area HA to increase a light extraction rate of the functional elements under the screen. The display area AA includes all film layers on the substrate 10, and the transition area TA is not used for display. The transition area TA may include a part of the film layers on the substrate 10, such as a part of the driving circuit layer 20 and the light-emitting function layer 30. In addition, in order to ensure the effective packaging performance of the transition area TA, a same packaging layer 40 as that in the display area AA may be disposed in the transition area TA.

In detail, the display panel 100 includes a substrate 10, a driving circuit layer 20, a light-emitting function layer 30, and a packaging layer 40 in the display area AA. Optionally, the substrate 10 may be a rigid substrate or a flexible substrate. When the substrate 10 is a rigid substrate, the substrate may include a rigid substrate, such as a glass substrate. When the substrate 10 is a flexible substrate, the substrate may include a flexible substrate, such as a polyimide (PI) film, an ultra-thin glass film, and the like. A flexible display panel 100 may be made using the flexible substrate as the substrate 10, so as to implement special performance of the display panel 100, such as bending and curling.

Taking a flexible substrate as the substrate 10 by way of example, the substrate 10 may include a flexible film and an inorganic film that are alternately stacked. For example, the substrate 10 includes a first PI film, a first inorganic film, a second PI film, and a second inorganic film that are stacked. In this way, the water and oxygen blocking performance of the substrate 10 may further be enhanced while realizing the flexibility of the substrate 10.

Optionally, a buffer layer (not shown) may further be disposed between the substrate 10 and the driving circuit layer 20. A material of the buffer layer may include inorganic materials, such as silicon oxide (SiOx), silicon nitride (SiNx), silicon oxynitride (SiON), and the like. The buffer layer can further prevent undesired impurities or contaminants (such as moisture, oxygen, or the like) from diffusing from the substrate 10 into devices that may be damaged by these impurities or contaminants. In addition, a flat top surface may further be provided.

Figure 3:
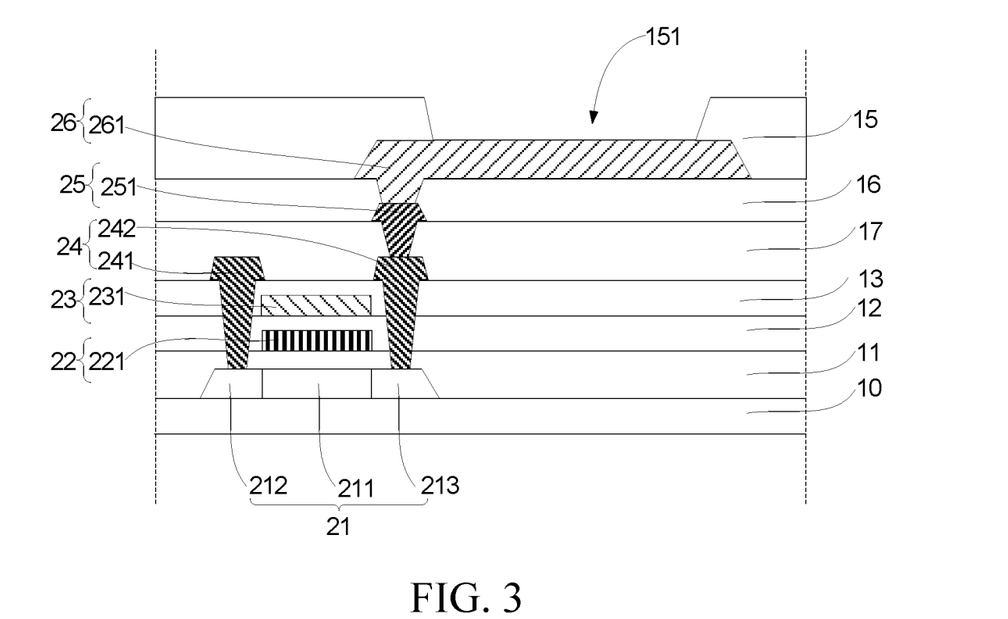
FIG. 3 is a schematic diagram of a detailed structure of a driving circuit layer according to an embodiment of the present disclosure.

Referring to FIGS. 2 and 3, FIG. 3 is a schematic diagram of a detailed structure of a driving circuit layer according to an embodiment of the present disclosure. The driving circuit layer 20 in the display area AA includes an active layer 21, gate insulating layers (such as a first gate insulating layer 11 and a second gate insulating layer 12 shown in FIGS. 2 and 3), gate layers (a first gate layer 22 and a second gate layer 23 shown in FIGS. 2 and 3), an interlayer insulating layer 13, a second metal layer 24, a first organic layer 17, a first metal layer 25, a second organic layer 16, a conductive electrode layer 26, and a pixel definition layer 15 that are sequentially stacked on the buffer layer. The first gate insulating layer 11, the second gate insulating layer 12, and the interlayer insulating layer 13 jointly form the inorganic layer 1. Certainly, the inorganic layer 1 may further include the buffer layer.

The active layer 21 includes a channel region 211 and a source region 212 and a drain region 213 located on two sides of the channel region 211. The first gate layer 22 includes a first gate 221 and various signal traces. The second gate layer 23 includes a second gate 231 and gate scan lines, and the like. The first gate 221 and the second gate 231 are both disposed corresponding to the channel region 211.

The second metal layer 24 is patterned to form a second source/drain line and data lines. The second source/drain line includes a first source line 241 and a first drain line 242. The first source line 241 is connected to the source region 212 through a via in the interlayer insulating layer 13. The first drain line 242 is connected to the drain region 213 through another via in the interlayer insulating layer 13.

The first metal layer 25 is patterned to form a first source/drain line and various signal lines, such as VDD and VSS. The first source/drain line is connected to the second source/drain line. In detail, the first source/drain line includes a second source line or a second drain line. Taking the second drain line 251 as an example, the second drain line 251 is connected to the first drain line 242 through a via in the first organic layer 17.

The conductive electrode layer 26 is patterned to form a pixel electrode 261. The pixel electrode 261 is connected to the second drain line 251 through a via in the second organic layer 16. The first organic layer 17 and the second organic layer 16 are both planarization layers. The planarization layer provides a flat film surface for the display panel 100 to improve the stability of preparing the light-emitting function layer 30.

The pixel definition layer 15 is disposed on the conductive electrode layer 26 and the second organic layer 16, and is patterned to form a pixel opening 151. A part of the pixel electrode 261 is exposed from the pixel opening 151, so as to define an emission area.

It should be noted that the structure of the driving circuit layer 20 of the present disclosure is not limited to that illustrated in the present embodiment. The driving circuit layer 20 of the present disclosure may further include more or fewer film layers. Positional relationships among all film layers are not limited to that illustrated in the present embodiment. For example, the first gate layer 22 and the second gate layer 23 may alternatively be located under the active layer 21 to form a bottom gate structure. The driving circuit layer 20 is configured to provide a driving voltage for the light-emitting function layer 30, so that the light-emitting function layer 30 emits light.

The light-emitting function layer 30 includes an emission material layer and a cathode (not shown). The emission material layer is formed by disposing emission materials of different colors on the entire surface of the driving circuit layer 20. The emission materials of different colors emit light of different colors. For example, a red emission material emits red light, a green emission material emits green light, and a blue emission material emits blue light.

The cathode covers the emission material layer. The emission material layer emits light under the joint action of the pixel electrode 261 and the cathode. The emission material layers of different colors emit light of different colors, thereby realizing the full-color display of the display panel 100.

Optionally, the pixel electrode 261 may be a transparent electrode or a reflective electrode. If the pixel electrode 261 is a transparent electrode, the pixel electrode 261 may be formed of, for example, indium tin oxide (ITO), indium zinc oxide (IZO), ZnO or $In_2O_3$. If the pixel electrode 261 is a reflective electrode, the pixel electrode 261 may include, for example, a reflective layer formed of Ag, Mg, Al, Pt, Pd, Au, Ni, Nd, Ir, Cr, or a combination thereof, and a layer formed of ITO, IZO, ZnO, or $In_2O_3$. However, the pixel electrode 261 is not limited thereto. The pixel electrode 261 may be formed of various materials, and may also form a single-layer structure or a multi-layer structure.

It should be noted that whether the pixel electrode 261 is a transparent electrode or a reflective electrode depends on a light exit direction of the display panel 100. When the display panel 100 emits light from the top, the pixel electrode 261 may be a transparent electrode or a reflective electrode. Certainly, when the reflective electrode is used, a utilization rate of light emitted by the emission material layer can be increased. When the display panel 100 emits light from the bottom, the pixel electrode 261 is a transparent electrode to increase the light transmittance. In the present embodiment, the display panel 100 emits light from the top by way of example. In order to increase the light transmittance, the cathode requires to be formed of a transparent conductive material. For example, the cathode may be formed of transparent conductive oxides (TCO), such as ITO, IZO, ZnO, $In_2O_3$, or the like.

Optionally, the light-emitting function layer 30 may further include a hole inject layer (HIL) and a hole transport layer (HTL) that are disposed between the emission material layer and the pixel electrode 261, and an electron inject layer (EIL) and an electron transport layer (ETL) that are disposed between the emission material layer and the cathode. The HIL is configured to receive a hole transmitted from the pixel electrode 261. The hole is transmitted to the emission material layer through the HTL. The EIL is configured to receive an electron transmitted from the cathode. The electron is transmitted to the emission material layer through the ETL. The hole and the electron are combined at the position of the emission material layer to generate an exciton. The exciton is transferred from an excited state to a ground state to release energy and emit light.

The packaging layer 40 covers the light-emitting function layer 30 and is configured to protect the emission material layer of the light-emitting function layer 30 to prevent water and oxygen intrusion from causing the emission material layer to fail.

Optionally, the packaging layer 40 may be packaged using a thin film. For example, the packaging layer 40 may be a stack structure formed by three layers of films of a first inorganic packaging layer, an organic packaging layer, and a second inorganic packaging layer that are sequentially stacked, or a stack structure having more layers. Materials of the first inorganic packaging layer and the second inorganic packaging layer include one or a combination of inorganic materials, such as silicon oxide, silicon nitride, and silicon oxynitride. Both the first inorganic packaging layer and the second inorganic packaging layer can be formed on the light-emitting function layer 30 by means of deposition processes, such as chemical vapor deposition (CVD), physical vapor deposition (PVD), atomic layer deposition (ALD), or the like. A material of the organic packaging layer includes one or more of organic materials, such as an epoxy material, an acrylic material, and the like. The organic packaging layer may be coated on the first inorganic packaging layer using one of coating processes, such as ink jet print (IJP), spraying, and the like.

A detailed structure of the display panel 100 in the transition area TA is described below.

Figure 4:
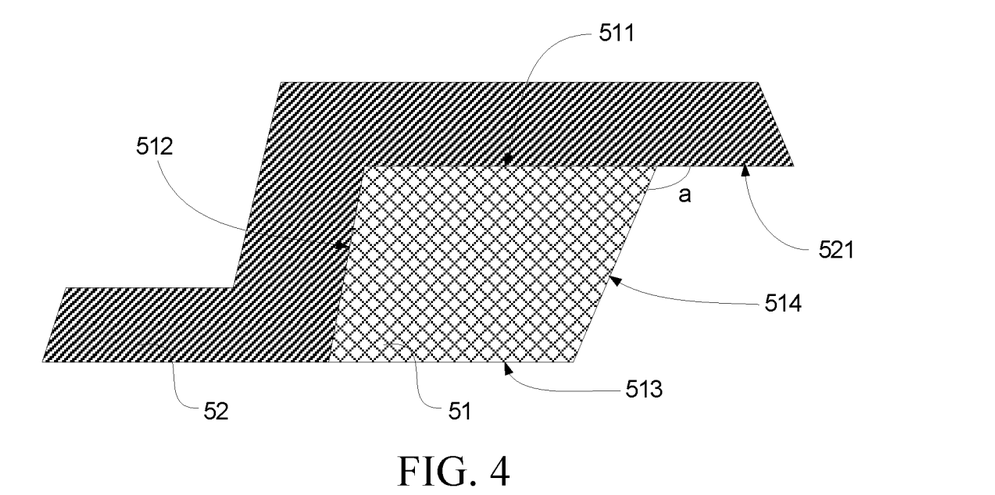
FIG. 4 is a schematic diagram of details of a first barrier portion and a second barrier portion according to an embodiment of the present disclosure.

Refer to FIGS. 1 to 4. FIG. 4 is a schematic diagram of details of a first barrier portion and a second barrier portion according to an embodiment of the present disclosure. In the transition area TA, the display panel 100 includes the substrate 10, an inorganic layer 1 disposed on the substrate 10, a plurality of first barrier portions 51 spaced apart on a side of the inorganic layer 1 that is away from the substrate 10, and second barrier portions 52 covering upper surfaces 511 and first side surfaces 512 of the first barrier portions 51.

In detail, each second barrier portion 52 covers the upper surface 511 and the first side surface 512 of each first barrier portion 51, and extends away from the first side surface 512 and beyond a boundary of the upper surface 511. That is, the second barrier portion 52 extends beyond an area where the first barrier portion 51 is disposed, so that the second barrier portion 52 has a suspended portion 521 relative to the first barrier portion 51, and the first barrier portion 51 and the first barrier portion 52 jointly form an undercut structure. The suspended portion 521 is a part of the second barrier portion 52 that exceeds beyond the upper surface of the first barrier portion 51. A width of the suspended portion 521 ranges from 1 micrometer to 100 micrometers.

It should be noted that the upper surface 511 of the first barrier portion 51 is a surface of the first barrier portion 51 that is away from the inorganic layer 1. A lower surface 513 of the first barrier portion 51 is opposite to the upper surface 511, and a side surface of the first barrier portion 51 is between the upper surface 511 and the lower surface 513. In the present disclosure, it is defined that: a side surface that forms an undercut structure together with the second barrier portion 52 is a second side surface 514 of the first barrier portion 51. The second side surface 514 is not covered by the second barrier portion 52. A side surface opposite to the second side surface 514 is the first side surface 512 of the first barrier portion 51, and the first side surface 512 is covered by the second barrier portion 52. The second side surface 514 may be a side surface of the first barrier portion 51 that is close to the display area AA, or may be a side surface of the first barrier portion 51 that faces away from the display area AA. That is, the undercut structure may be formed on a side of the first barrier portion 51 that faces the display area AA or a side of the first barrier portion that faces away from the display area AA.

In addition, optionally, the second side surface 514 of the first barrier portion 51 may be an inclined surface, so that an included angle a between the second side surface 514 and the second barrier portion 52 beyond the upper surface 511 is greater than 90 degrees. The included angle a is also an included angle between the second side surface 514 and the suspended portion 521. In this way, the undercut structure formed by the first barrier portion 51 and the second barrier portion 52 can be deeper, so that the emission material layer is easier to break at the undercut structure.

Further, the first barrier portion 51 is formed by the first organic layer 17, and the second barrier portion 52 is formed by the first metal layer 25. That is, the first barrier portion 51 and the first organic layer 17 are disposed on a same layer, and the second barrier portion 52 and the first source/drain line are disposed on a same layer. The "same layer arrangement" in the present disclosure means that in the preparation process, the film layer formed of a same material is patterned to obtain at least two different features, and then the at least two different features are arranged on a same layer. For example, in the present embodiment, the first barrier portion 51 and the first organic layer 17 are obtained by patterning a same organic material film, and the first barrier portion 51 and the first organic layer 17 are disposed on a same layer. For another example, the second barrier portion 52 and the first source/drain line are obtained by patterning the first metal layer 25, and the second barrier portion 52 and the first source/drain line are disposed on a same layer.

Since the first barrier portion 51 and the second barrier portion 52 jointly form an undercut structure, when the emission material layer is disposed on the entire surface, the emission material layer is disconnected at the corresponding undercut structure. In this way, the emission material layer of the transition area TA is discontinuous, so as to block the path of water and oxygen conducting the display area AA along the emission material layer.

In addition, the second barrier portion 52 further covers the first side surface 512 of the first barrier portion 51 and extends to the inorganic layer 1, so that the first barrier portion 51 and the second barrier portion 52 jointly form a unilateral undercut structure. In this way, the emission material layer can only be in contact with one side surface (that is, the second side surface 514) of a same first barrier portion 51. That is, the first barrier portion 51 is only in contact with the emission material layer at the undercut structure. The upper surface 511 and the first side surface 512 of the first barrier portion 51 are covered by a second barrier portion 52 to block the contact of the emission material layer with the first barrier portion 51, thereby preventing the emission material layer and the first barrier portion 51 from forming a new water and oxygen conduction path.

Optionally, a quantity of the first barrier portions 51 is greater than or equal to 5, and two adjacent first barrier portions 51 are spaced apart by a spacing. A sufficient quantity of the first barrier portions 51 are disposed to form a corresponding quantity of undercut structures. In this way, the reliability of blocking the water and oxygen conduction path can be improved, thereby realizing effective packaging.

Optionally, every two adjacent first barrier portions 51 are spaced apart by a same spacing, so that the first barrier portions 51 are uniformly distributed in the transition area TA. In this way, the blocked emission material layer is also uniformly distributed, so as to achieve a better capability of blocking water and oxygen conduction. In addition, the first barrier portions 51 that are uniformly distributed are disposed. This is more feasible in the process, and facilitates the process simplification.

Further, in the transition area TA, a groove 70 is provided in an area of the inorganic layer in which no first barrier portion 51 is disposed. Optionally, the groove 70 is provided on the corresponding inorganic layers spaced apart between two adjacent first barrier portions 51, and the groove 70 is close to the second side surface 514 of the first barrier portion 51 that is not covered by the second barrier portion 52. The quantity of the grooves 70 may be configured according to the quantity of the first barrier portions 51 or actual requirements.

Optionally, the groove 70 extends through at least part of the inorganic layer 1. Since the inorganic layer 1 includes the buffer layer, the first gate insulating layer 11, the second gate insulating layer 12, and the interlayer insulating layer 13, the groove 70 may be provided on the interlayer insulating layer 13 or extends through the interlayer insulating layer 13 to the second gate insulating layer 12, the first gate insulating layer 11, and the buffer layer.

It should be noted that, in order to ensure effective packaging of the transition area TA, there are numerous inorganic film layers in the transition area TA, and a cutting process is used when the functional area HA is hollowed out. Cracks may occur during cutting. The generated cracks extend to the display area AA along the inorganic film layer, so as to form a water and oxygen conduction path. In the present disclosure, a groove 70 is provided on the inorganic layer of the transition area TA, so that the generated crack is stopped when extending to the groove 70, so as to prevent the crack from extending to the display area AA.

Moreover, the groove 70 is provided close to the second side surface 514 of the first barrier portion 51. In this way, the groove 70 may be combined with the undercut structure to form a deep hole, so that the emission material layer is easier to break at the undercut structure.

Further, a retaining wall structure 60 is further disposed on the inorganic layer where the first barrier portion 51 is not disposed in the transition area TA. Certainly, the retaining wall structure 60 may also be located in a gap between two adjacent first barrier portions 51, and the groove 70 may no longer be provided in the gap where the retaining wall structure 60 is disposed. However, the present disclosure is not limited to that the retaining wall structure 60 and the groove 70 of the present disclosure may be located in a same gap.

The retaining wall structure 60 includes a first retaining wall portion 61, a second retaining wall portion 62, and a third retaining wall portion 63 that are stacked. The first retaining wall portion 61 is formed by the second inorganic layer 16, and the second retaining wall portion 62 is formed by the pixel definition layer 15. That is, the first retaining wall portion 61 and the second organic layer 16 are disposed on a same layer, and the second retaining wall portion 62 and the pixel definition layer 15 are disposed on a same layer.

It should be noted that the organic packaging layer 40 in the packaging layer 40 is prepared using a process, such as ink jet print, and the printed organic materials have fluidity. In order to prevent the ink jet print materials from overflowing too much, a plurality of retaining wall structures 60 further require to be disposed the display panel 100, so as to block the flow of the printed organic material. The retaining wall structure (not shown) of the display area AA serves as the main retaining wall to mainly prevent overflow. The retaining wall structure 60 of the transition area TA can play a secondary blocking role and a slight anti-crack effect when ink jet print materials are slightly overflowed.

Figure 5:
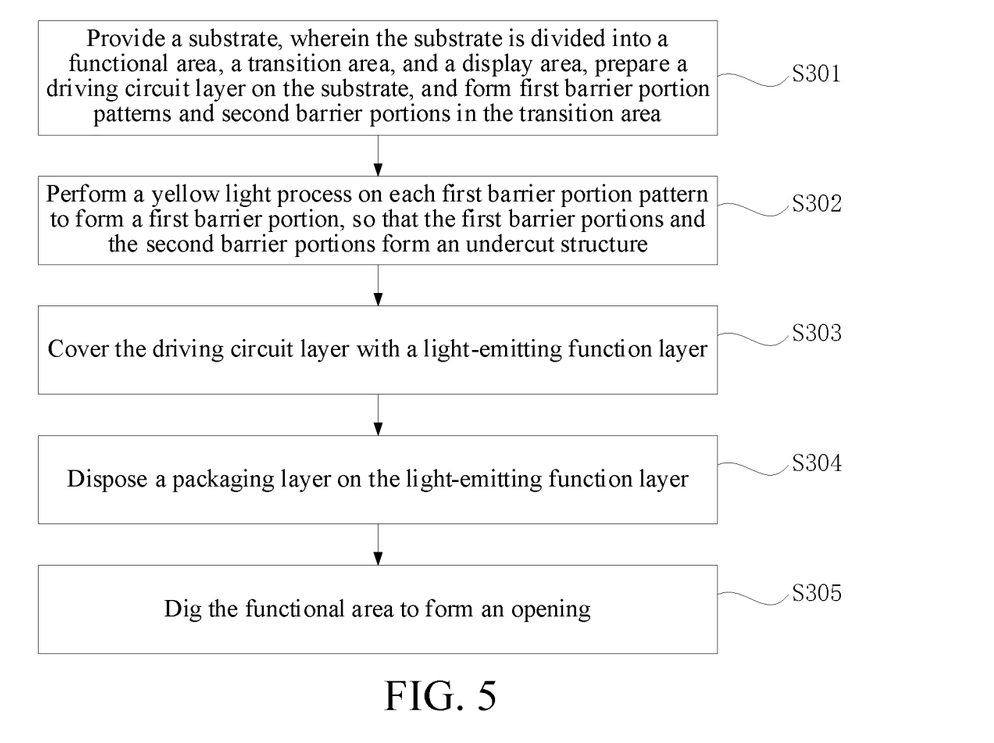
FIG. 5 is a schematic flowchart of a method for preparing a display panel according to an embodiment of the present disclosure.

Based on a same inventive concept, an embodiment of the present disclosure further provides a method for preparing a display panel. The method is used for preparing the display panel of one of the above embodiments. Refer to FIGS. 1 to 9. FIG. 5 is a schematic flowchart of a method for preparing a display panel according to an embodiment of the present disclosure. FIGS. 6 to 9 are schematic diagrams of a film structure of a display panel manufactured using each step in the method for preparing a display panel according to an embodiment of the present disclosure. The method for preparing a display panel includes steps below.

Figure 6:
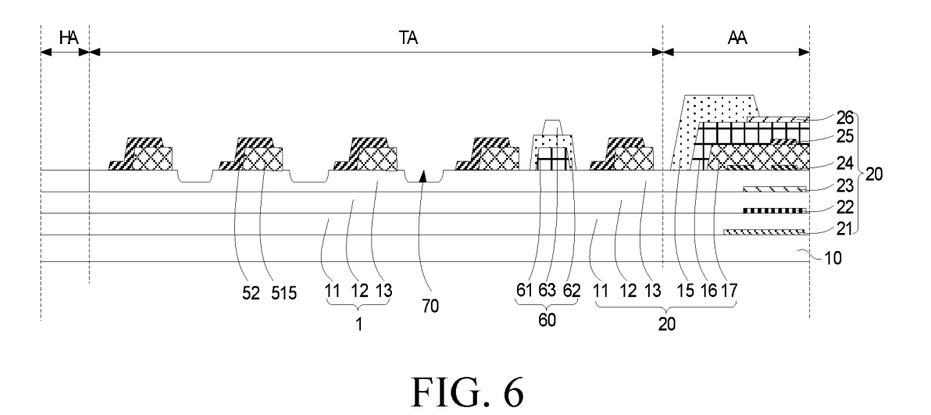
FIGS. 6 to 9 are schematic diagrams of a film structure of a display panel manufactured using each step in the method for preparing a display panel according to an embodiment of the present disclosure.

Step S301: Provide a substrate 10, wherein the substrate 10 is divided into a functional area HA, a transition area TA, and a display area AA, prepare a driving circuit layer 20 on the substrate 10, and form first barrier portion patterns 515 and second barrier portions 52 in the transition area TA, as shown in FIG. 6.

In detail, the substrate 10 may be a rigid substrate or a flexible substrate. Taking a flexible substrate as the substrate 10 by way of example, the substrate 10 may include a flexible film and an inorganic film that are alternately stacked. For example, the substrate 10 includes a first PI film, a first inorganic film, a second PI film, and a second inorganic film that are stacked. In this way, the water and oxygen blocking performance of the substrate 10 may further be enhanced while realizing the flexibility of the substrate 10.

Optionally, a buffer layer may further be disposed between the substrate 10 and the driving circuit layer 20. The driving circuit layer 20 includes, in the display area AA, an active layer 21, a first gate insulating layer 11, a first gate layer 22, a second gate insulating layer 12, a second gate layer 23, an interlayer insulating layer 13, a second metal layer 24, a first organic layer 17, a first metal layer 25, a second organic layer 16, a conductive electrode layer 26, and a pixel definition layer 15 that are sequentially stacked on the buffer layer. The conductive electrode layer 26 is connected to the first metal layer 25 through the via in the second organic layer 16.

The driving circuit layer 20 includes the inorganic layer 1 formed by the first gate insulating layer 11, the second gate insulating layer 12, and the interlayer insulating layer 13 in both the transition area TA and the functional area HA. Certainly, the inorganic layer 1 of the transition area TA and the functional area HA may further include the buffer layer.

In addition, the driving circuit layer 20 further forms a plurality of first barrier portion patterns 515 and second barrier portions 52 in the transition area TA. The second barrier portion 52 covers a part of an upper surface of the first barrier portion pattern 515 and a first side surface of the first barrier portion pattern 515. The first barrier portion pattern 515 and the first organic layer 17 are disposed on a same layer, and the second barrier portion 52 and the first metal layer 25 are disposed on a same layer.

The driving circuit layer 20 further includes, in the transition area TA, a groove 70 provided on the inorganic layer 1. In detail, the groove 70 is provided on the corresponding inorganic layers 1 spaced apart between two adjacent first barrier portion patterns 515, and is close to a second side surface of the first barrier portion pattern 515. The groove 70 and the via in the second organic layer 16 are formed using a same process.

The driving circuit layer 20 further includes a retaining wall structure 60 disposed on the surface of the inorganic layer 1 in the transition area TA. The retaining wall structure 60 includes a first retaining wall portion 61, a second retaining wall portion 62, and a third retaining wall portion 63 that are stacked. The first retaining wall portion 61 and the second organic layer 16 are disposed on a same layer, and the second retaining wall portion 62 and the pixel definition layer 15 are disposed on a same layer.

Figure 7:
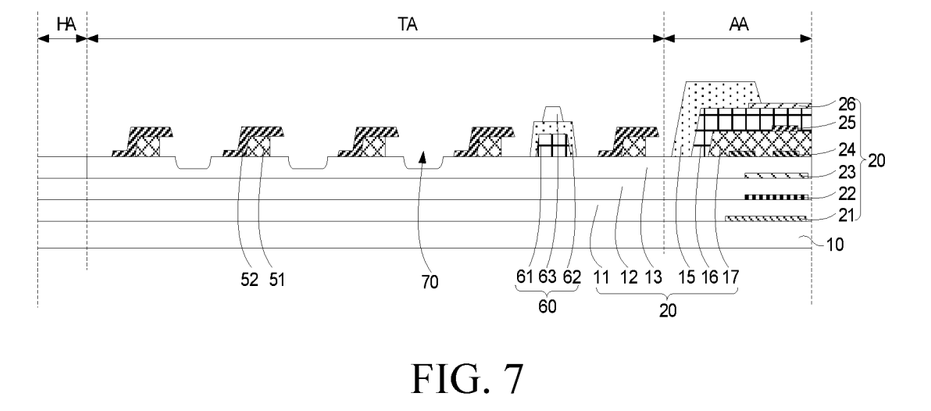

Step S302: Perform a yellow light process on the first barrier portion patterns 515 to form first barrier portions 51, so that the first barrier portions 51 and the second barrier portions 52 form an undercut structure, as shown in FIG. 7.

In detail, a photoresist is coated on the driving circuit layer 20, and exposed and developed to form a photoresist pattern. The photoresist pattern is exposed from the first barrier portion pattern 515 that is not blocked by the second barrier portion 52.

The exposed first barrier portion pattern 515 is dry-etched using the photoresist pattern as a shield until the interlayer insulating layer 13 is exposed. Then the first barrier portion pattern 515 is side-etched to form the first barrier portion 51, and the second barrier portion 52 is partially suspended, so that the first barrier portion 51 and the second barrier portion 52 form an undercut structure.

The photoresist pattern is peeled off, and the second barrier portion 52 is exposed.

Figure 8:
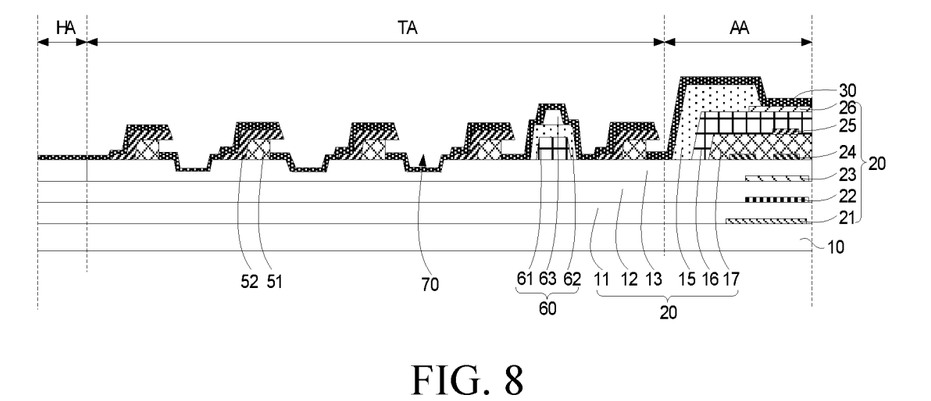

Step S303: Cover the driving circuit layer 20 with a light-emitting function layer 30, as shown in FIG. 8.

In detail, the entire surface of the driving circuit layer 20 is covered with the light-emitting function layer 30. The light-emitting function layer 30 is broken at the undercut structure formed by the first barrier portion 51 and the second barrier portion 52.

Figure 9:
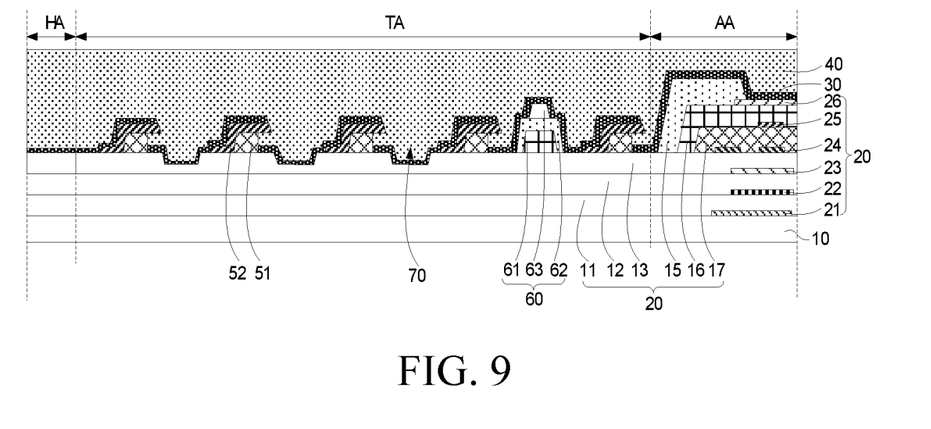

Step S304: Dispose a packaging layer 40 on the light-emitting function layer 30, as shown in FIG. 9.

In detail, the packaging layer 40 may be packaged using a thin film. For example, the packaging layer 40 may be a stack structure formed by three layers of films of a first inorganic packaging layer, an organic packaging layer, and a second inorganic packaging layer that are sequentially stacked, or a stack structure having more layers.

Step S305: Dig the functional area HA to form an opening 200, as shown in FIG. 2.

In detail, a cutting process, such as laser cutting may be used to dig the functional area HA to form the opening 200, so as to form the display panel 100.

An embodiment of the present disclosure further provides a display device. The display device includes an electronic device, such as a mobile phone, a tablet, and the like. The display device includes the display panel of one of the above embodiments and a functional element corresponding to the functional area of the display panel. The functional element includes a receiver, a camera, various sensors, and the like, so as to implement functions, such as an under-screen camera, an under-screen fingerprint, and the like.

It may be learned, according to the above embodiments, that the present disclosure provides a display panel, a display device, and a manufacturing method for the display panel. The display panel includes a functional area, a display area close to the functional area, and a transition area between the functional area and the display area. The display panel includes, in the transition area, a substrate, an inorganic layer disposed on the substrate, and at least one barrier member disposed on a side of the inorganic layer that is away from the substrate. Each barrier member includes a first barrier portion and a second barrier portion. The first barrier portion is located between the second barrier portion and the inorganic layer. The second barrier portion covers the upper surface of the first barrier portion. An orthographic projection area of the second barrier portion on the substrate is greater than an orthographic projection area of the first barrier portion on the substrate, so that the barrier member forms an undercut structure. In this way, during preparation of emission layers, the emission layers are disconnected at the undercut structure of the barrier member to block the water and oxygen immersion path formed by the emission layers, thereby resolving the problem that in conventional OLED products, water and oxygen gas are easily transmitted from outside of the display panel to inside using the emission layer.

In the foregoing embodiments, the descriptions of each embodiment have different focuses, and for a part that is not described in detail in an embodiment, reference may be made to the relevant description of other embodiments.

The embodiments of the present disclosure are described in detail above. The principles and implementations of the present disclosure are described through specific examples in the present disclosure, and the descriptions of the embodiments are merely intended to help understand the methods and core ideas of the present disclosure. A person of ordinary skill in the art should understand that modifications may be made to the technical solutions described in the foregoing embodiments or equivalent replacements may be made to some technical features thereof, as long as such modifications or replacements do not make the essence of corresponding technical solutions depart from the scope of the technical solutions of the embodiments of the present disclosure.

What is claimed is:

1. A display panel, comprising a functional area, a display area close to the functional area, and a transition area located between the functional area and the display area, and further comprising:
- a substrate;
- an inorganic layer, disposed on a side of the substrate;
- a first organic layer, disposed on a side of the inorganic layer that is away from the substrate and in the transition area, a plurality of first barrier portions disposed and spaced apart from each other; and
- a first metal layer, disposed on a side of the first organic layer that is away from the inorganic layer and in the transition area, second barrier portions disposed and covering the first barrier portions, wherein
- each of the second barrier portions covers an upper surface and a first side surface of each first barrier portion, and the each second barrier portion covering the upper surface of the each first barrier portion extends away from the first side surface and beyond a boundary of the upper surface.

2. The display panel as claimed in claim 1, wherein the first metal layer forms a first source/drain line in the display area, the display panel further comprises a second metal layer disposed on a side of the inorganic layer that faces the first organic layer, the first organic layer covers the second metal layer, the second metal layer forms a second source/drain line in the display area, and the second source/drain line is connected to the first source/drain line through a via in the first organic layer.

3. The display panel as claimed in claim 2, further comprising:
- a second organic layer, covering the first metal layer and the first organic layer;
- a conductive electrode layer, disposed on the second organic layer and forming a pixel electrode in the display area, wherein the pixel electrode is connected to the first source/drain line through a via in the second organic layer; and
- a pixel definition layer, covering a part of the pixel electrode and the second organic layer, wherein a pixel opening is formed in the display area.

4. The display panel as claimed in claim 3, wherein the inorganic layer comprises a buffer layer, a gate insulating layer, and an interlayer insulating layer that are stacked, and the display panel further comprises:
- a semiconductor layer, disposed on the buffer layer and comprising a source region and a drain region; and
- a gate layer, disposed on the gate insulating layer, wherein the second metal layer is disposed on the interlayer insulating layer, the second source/drain line comprises a first source line and a first drain line, and the first source line and the first drain line are respectively connected to the corresponding source region and the corresponding drain region through vias in the interlayer insulating layer.

5. The display panel as claimed in claim 3, wherein a retaining wall structure is further disposed on the inorganic layer in the transition area, and the retaining wall structure is located on a side of the first barrier portion that is close to the display area, and comprises a first retaining wall portion, a second retaining wall portion, and a third retaining wall portion that are stacked, wherein the first retaining wall portion is formed by the second organic layer, and the second retaining wall portion is formed by the pixel definition layer.

6. The display panel as claimed in claim 1, wherein an included angle between a second side surface of the first barrier portion that is not covered by the second barrier portion and the second barrier portion beyond the upper surface is greater than or equal to 90 degrees.

7. The display panel as claimed in claim 6, wherein a width of the second barrier portion beyond the upper surface ranges from 1 micrometer to 100 micrometers.

8. The display panel as claimed in claim 1, wherein a corresponding groove is provided in an area of the inorganic layer in the transition area that is between adjacent first barrier portions, and an extending direction of the groove is same as an extending direction of the first barrier portion.

9. The display panel as claimed in claim 8, wherein the groove is provided close to a second side surface of the first barrier portion that is not covered by the second barrier portion.

10. The display panel as claimed in claim 9, wherein the groove extends through at least part of the inorganic layer.

11. The display panel as claimed in claim 1, wherein a quantity of the first barrier portions is greater than or equal to 5, and two adjacent first barrier portions are spaced apart by a spacing.

12. The display panel as claimed in claim 11, wherein every two adjacent first barrier portions are spaced apart by a same spacing.

13. A display device, comprising a display panel and a functional element, wherein the display panel comprises a functional area, a display area close to the functional area, and a transition area located between the functional area and the display area, the functional element is disposed corresponding to the functional area, and the display panel further comprises:
- a substrate;
- an inorganic layer, disposed on a side of the substrate;
- a first organic layer, disposed on a side of the inorganic layer that is away from the substrate and forming, in the transition area, a plurality of first barrier portions spaced apart from each other; and
- a first metal layer, disposed on a side of the first organic layer that is away from the inorganic layer and forming, in the transition area, second barrier portions covering the first barrier portions, wherein
- each of the second barrier portions covers an upper surface and a first side surface of each first barrier portion, and the each second barrier portion covering the upper surface of the each first barrier portion extends away from the first side surface and beyond a boundary of the upper surface.

14. The display device as claimed in claim 13, wherein the first metal layer forms a first source/drain line in the display area, the display panel further comprises a second metal layer disposed on a side of the inorganic layer that faces the first organic layer, the first organic layer covers the second metal layer, the second metal layer forms a second source/drain line in the display area, and the second source/drain line is connected to the first source/drain line through a via in the first organic layer.

15. The display device as claimed in claim 14, wherein the display panel further comprises:
- a second organic layer, covering the first metal layer and the first organic layer;
- a conductive electrode layer, disposed on the second organic layer and forming a pixel electrode in the display area, wherein the pixel electrode is connected to the first source/drain line through a via in the second organic layer; and a pixel definition layer, covering a part of the pixel electrode and the second organic layer, wherein a pixel opening is formed in the display area.

16. The display device as claimed in claim 15, wherein the inorganic layer comprises a buffer layer, a gate insulating layer, and an interlayer insulating layer that are stacked, and the display panel further comprises:
- a semiconductor layer, disposed on the buffer layer and comprising a source region and a drain region; and
- a gate layer, disposed on the gate insulating layer, wherein the second metal layer is disposed on the interlayer insulating layer, the second source/drain line comprises a first source line and a first drain line, and the first source line and the first drain line are respectively connected to the corresponding source region and the corresponding drain region through vias in the interlayer insulating layer.

17. The display device as claimed in claim 15, wherein a retaining wall structure is further disposed on the inorganic layer in the transition area, and the retaining wall structure is located on a side of the first barrier portion that is close to the display area, and comprises a first retaining wall portion, a second retaining wall portion, and a third retaining wall portion that are stacked, wherein the first retaining wall portion is formed by the second organic layer, and the second retaining wall portion is formed by the pixel definition layer.

18. The display device as claimed in claim 13, wherein an included angle between a second side surface of the first barrier portion that is not covered by the second barrier portion and the second barrier portion beyond the upper surface is greater than or equal to 90 degrees.

19. The display device as claimed in claim 13, wherein a corresponding groove is provided in an area of the inorganic layer in the transition area that is between adjacent first barrier portions, and an extending direction of the groove is same as an extending direction of the first barrier portion.

20. The display device as claimed in claim 13, wherein a quantity of the first barrier portions is greater than or equal to 5, and two adjacent first barrier portions are spaced apart by a spacing.

* * * * *